United States Patent [19]

Konishi

[11] Patent Number: 4,649,291
[45] Date of Patent: Mar. 10, 1987

[54] VOLTAGE REFERENCE CIRCUIT FOR PROVIDING A PREDETERMINED VOLTAGE TO AN ACTIVE ELEMENT CIRCUIT

[75] Inventor: Satoshi Konishi, Tokyo, Japan

[73] Assignee: Kabushiki Kaisha Toshiba, Kawasaki, Japan

[21] Appl. No.: 613,291

[22] Filed: May 23, 1984

[30] Foreign Application Priority Data

May 26, 1983 [JP] Japan .................................. 58-92644

[51] Int. Cl.[4] ..................... H03K 3/027; H03K 3/353; H03K 17/687; G11C 7/00
[52] U.S. Cl. .................................... 307/297; 307/264; 307/270; 307/304; 307/475
[58] Field of Search ............... 307/270, 450, 544, 554, 307/570, 475, 482, 578, 582, 583, 297, 296 R, 264; 365/227, 226, 228

[56] References Cited

U.S. PATENT DOCUMENTS

| | | | |
|---|---|---|---|
| 3,956,661 | 5/1976 | Sakamoto et al. | 307/297 |
| 3,995,172 | 11/1976 | Freeman et al. | 307/450 X |
| 4,016,434 | 4/1977 | DeFilippi | 307/297 |
| 4,065,678 | 12/1977 | Reese et al. | 307/270 X |
| 4,315,307 | 2/1982 | Jacquart | 307/584 X |
| 4,365,172 | 12/1982 | Prater | 307/450 X |
| 4,384,216 | 5/1983 | Pricer | 307/270 |
| 4,424,456 | 1/1984 | Shiraki et al. | 307/475 X |
| 4,441,172 | 4/1984 | Ebel | 365/226 |
| 4,450,371 | 5/1984 | Bismarck | 307/264 X |
| 4,469,960 | 9/1984 | Raghunathan | 307/264 |
| 4,489,246 | 12/1984 | Nishiuchi | 307/450 X |
| 4,585,955 | 4/1986 | Uchida | 365/226 X |

FOREIGN PATENT DOCUMENTS

| | | | |
|---|---|---|---|
| 3138558 | 4/1983 | Fed. Rep. of Germany | 307/297 |
| 25373 | 3/1981 | Japan | 307/570 |
| 0059590 | 4/1985 | Japan | 365/226 |

OTHER PUBLICATIONS

Mano et al., "Submicron VLSI Memory Circuits," IEEE International Solid-State Circuits Conference, ISSCC 83, Feb. 25, 1983.

Primary Examiner—Stanley D. Miller
Assistant Examiner—David R. Bertelson
Attorney, Agent, or Firm—Finnegan, Henderson, Farabow, Garrett & Dunner

[57] ABSTRACT

A semiconductor integrated circuit includes a function circuit which has a plurality of active elements and performs a predetermined circuit function and which is coupled between a node and a reference terminal; a potential setting circuit, coupled between a power supply terminal and the above-mentioned node, for setting a potential at this node; and a capacitor, coupled between this node and the reference terminal, for smoothing the potential at this node. The function circuit generates a control signal and a conductance between the power supply terminal and the node is varied in response to this control signal, so that the potential setting circuit keeps the potential at this node within a predetermined range, regardless of the current consumed at the function circuit.

21 Claims, 30 Drawing Figures

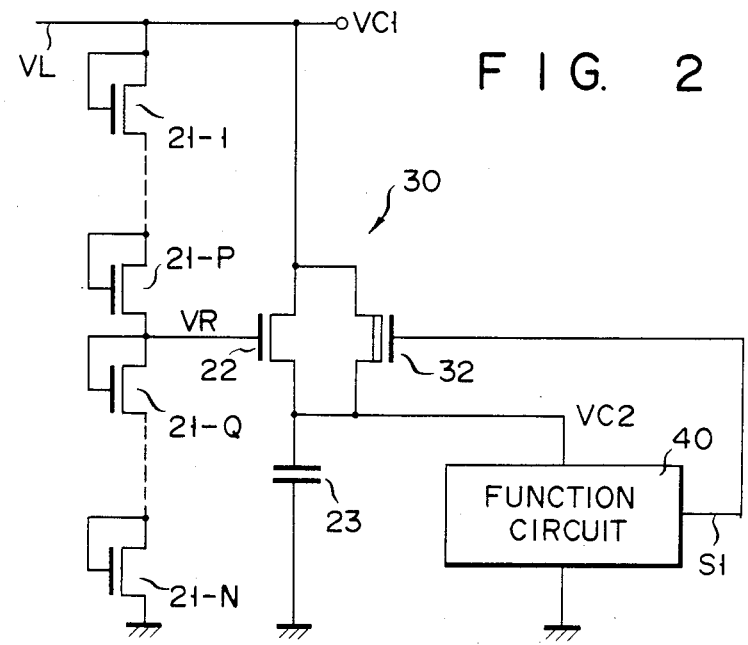
F I G. 2

VOLTAGE REFERENCE CIRCUIT FOR PROVIDING A PREDETERMINED VOLTAGE TO AN ACTIVE ELEMENT CIRCUIT

BACKGROUND OF THE INVENTION

The present invention relates to a semiconductor integrated circuit which is suitable for high integration and, more particularly, to a semiconductor integrated circuit in which a potential having an absolute value smaller than a power potential to be supplied from an external power supply is used as a power potential to drive an internal active element circuit.

Semiconductor integrated circuits consisting of MOS transistors have been developed remarkably, and in the latter half of the 1960's, a semiconductor integrated circuit had been created in which tens or hundreds of MOS transistors, each having an effective channel length of about 10 μm, were formed on one chip. Furthermore, the finer processing and higher integration of elements have advanced, so that recently a very large scale integrated circuit (VLSI) has been realized which includes a few hundred thousand of elements each having an effective channel length of about 1.5 μm. In the future, it is expected that a semiconductor integrated circuit using submicron MOS transistors, each having an effective channel length of 1 μm or less, can be formed.

In order to drive the MOS transistor whose effective channel length has been shortened in this way, it is necessary to use a driving voltage which is lower than a power supply voltage. This is because if this kind of MOS transistor is driven by the power supply voltage, a high electric field will be produced inside the MOS transistor causing various problems. From a viewpoint of the system's applications, it is desirable to commonly use a power supply for each integrated circuit constituting the system in consideration of the miniaturization and low cost. Furthermore, to increase the applicability to a system using a TTL, it is also preferable to set the power supply potential at 5 V, which is now used as the standard power supply voltage.

FIG. 1 shows a semiconductor integrated circuit comprising a function circuit 10 having MOS transistors which have short channel lengths, and an operating voltage supplying circuit 20 for supplying the operating voltage which makes this function circuit 10 operative.

This operating voltage supplying circuit 20 is formed of an MOS transistor 22. The drain of the MOS transistor 22 is connected to the voltage line VL, the source is grounded through a capacitor 23 and the gate is connected to a junction between the MOS transistors 21-P and 21-Q which are a part of the series of N MOS transistors 21-1, ..., 21-P, 21-Q, ..., and 21-N which are connected in series between a voltage line VL to which a voltage equal to a power supply voltage VC1 is supplied and the ground. The gate of each of the MOS transistors 21-1 to 21-N is coupled to its drain. In addition, the function circuit 10 is coupled between the source of the MOS transistor 22 and the ground. This function circuit 10 is, for example, a memory circuit including MOS transistors or the like which is needed as it is driven by a lower voltage than the power supply voltage VC1. All of the MOS transistors 21-1 to 21-N and 22 are of the enhancement type.

A reference voltage VR is applied to the gate of the MOS transistor 22. This reference voltage VR is obtained by dividing the power supply voltage VC1 in accordance with a ratio between a reciprocal of the conductance of the MOS transistors 21-1 to 21-P and a reciprocal of the conductance of the MOS transistors 21-Q to 21-N. Therefore, assuming that a threshold voltage of the MOS transistor 22 is VT, an operating voltage VC2 to the function circuit 10 is given by the following expression:

$$VC2 = VR - VT \quad (1)$$

In the above equation (1), the MOS transistor 22 is operating with the pentode characteristics and is set into the state close to the off state. When a current to be consumed by the function circuit 10 increases and the operating voltage VC2 becomes lower than (VR−VT), the MOS transistor 22 is rendered conductive, so that a large current is supplied to function circuit 10 from the voltage line VL through this MOS transistor 22, thereby compensating for the decrease in the operating voltage VC2. In the case where the consumption current of this function circuit 10 is relatively large even for a short time, since the current supplying ability of the MOS transistor 22 is not large enough, the consumption current is also supplied from the capacitor 23 as a discharge current to smooth the operating voltage VC2, thus preventing a remarkable reduction of this operating voltage VC2. In this way, to use this capacitor 23 to prevent the instantaneous reduction of the operating voltage VC2, this capacitor 23 must have large capacitance. However, to form a capacitor having a large capacitance in an integrated circuit, a large occupied area is required, which becomes an obstacle to the miniaturization and high integration of the circuit.

For example, in a dynamic RAM (d-RAM) of 64 kbits in which the voltages VC1 and VC2 are set at 5 V and 3 V, respectively, a peak current of about 150 mA will be consumed for an interval of about 15 nsec in the active operation mode. In this case, the capacitance C of the capacitor 23 which is needed to suppress the instantaneous reduction in voltage VC2 to be 10% or less is given by the following expression:

$$C = \frac{150 \times 10^{-3}(A) \times 15 \times 10^{-9}(S)}{3(V) \times 0.1} = 7500 \text{ (pF)} \quad (2)$$

If this capacitor of 7500 pF is formed by an MOS capacitor having an oxide insulator with a film thickness of 250 Å, the occupied area A needed for this capacitor is given by the following expression:

$$A = \frac{7500 \times 10^{-12} \text{ (farad)}}{\frac{3.45 \times 10^{-13} \text{ (farad/cm)}}{250 \times 10^{-8} \text{ (cm)}}} \approx 5.43 \times 10^{-2} \text{ (cm}^2\text{)} \quad (3)$$

This occupied area A is substantially equal to an area of a square whose side length is 2.33 mm. Since a chip area of an RAM having 2 μm design rule is about 18 mm² as well, the area of this capacitor will have to be at least about 30% of the chip area. Furthermore, it is necessary to suppress the variation in the operating voltage VC2 to be smaller than 10% in order to improve the operating margin of the function circuit 10, which results in the increase of the occupied area of the capacitor.

In this way, in the integrated circuit shown in FIG. 1, the occupied area of the capacitor 23 to suppress the variation in the operating voltage VC2 becomes so large that there is the drawback such that the degree of integration will decrease.

SUMMARY OF THE INVENTION

It is an object of the present invention to provide a compact semiconductor integrated circuit in which a function circuit is made operative at a potential which has an absolute value smaller than a power supply potential to be supplied from an external power supply and whose variation is suppressed.

This object is accomplished by a semiconductor integrated circuit comprising a function circuit which has a plurality of active elements to perform a predetermined circuit function and which is coupled between a node and a reference terminal to produce a control signal; a potential setting circuit which is coupled between a power supply terminal and the above-mentioned node to set a potential at this node and whose conductance is variable in response to the control signal from the function circuit; and a smoothing circuit, coupled between the node and the reference terminal, for smoothing the potential at the node.

In the present invention, in the case where a current large enough to vary the potential at the node is allowed to flow through the function circuit, a control signal is generated from the function circuit thereby changing the conductance of the potential setting circuit and permitting this potential setting circuit to keep the potential at the node constant. Therefore, it is not necessary to improve the smoothing ability of the foregoing smoothing circuit, and it becomes possible to improve the degree of integration because of no need of a large capacitor.

BRIEF DESCRIPTION OF THE DRAWINGS

FIG. 2 shows a semiconductor integrated circuit according to one embodiment of the present invention which includes a function circuit to be made operative at a voltage lower than a power supply voltage;

DETAILED DESCRIPTION OF THE PREFERRED EMBODIMENTS

FIG. 2 shows a semiconductor integrated circuit according to one embodiment of the present invention. This semiconductor integrated circuit is constituted substantially in the similar manner to that shown in FIG. 1 except that an operating voltage supplying circuit 30 has a depletion type MOS transistor 32 coupled in parallel with the enhancement type MOS transistor 22 and that a function circuit 40 for generating a control signal S1 to change the conductance of the MOS transistor 32.

Figure 3:
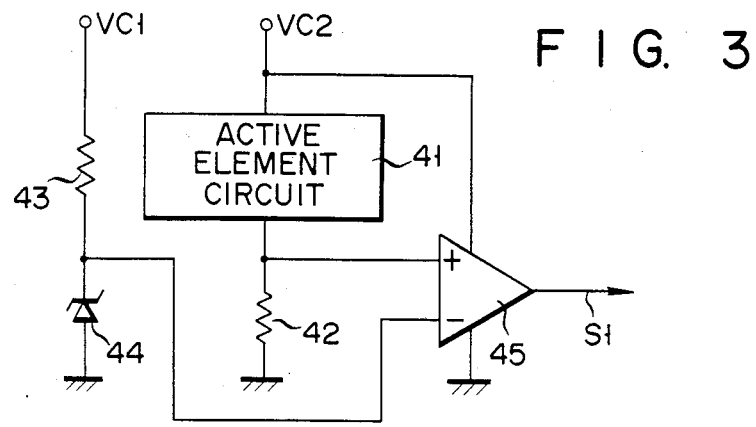
FIGS. 3 and 4 show the examples of the function circuit shown in FIG. 2, respectively.

FIG. 3 shows an example of this function circuit 40. This function circuit includes an active element circuit 41, such as a RAM, a ROM or a CPU, whose consumption current depends upon the operating mode; a resistor 42 coupled in series to this consumption current path; a constant voltage circuit including a resistor 43 and a Zener diode 44 which are coupled between the terminal VC1 and the ground; and a comparator 45 for comparing an output voltage of this constant voltage circuit and a voltage drop at the resistor 42. When the voltage drop at the resistor 42 becomes larger than a predetermined value which is set by the series circuit of the resistor 43 and the Zener diode 44, namely, when a comsumption current in the active element circuit 41 becomes larger than the predetermined value, this comparator 45 supplies a high level control signal S1 to render the MOS transistor 32 conductive.

Figure 4:
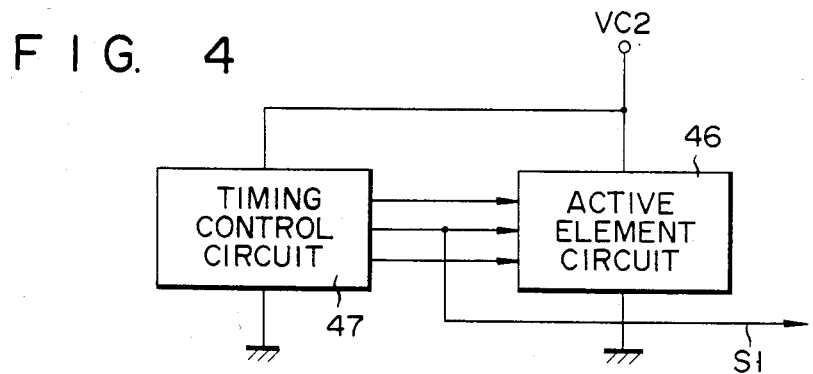

FIG. 4 shows another example of the function circuit 40 shown in FIG. 2. This function circuit includes an active element circuit 46 constituting organic circuits which include, for example, a memory cell array, a decoder, a buffer, etc. of a RAM or ROM; and a timing control circuit 47 for supplying a series of timing pulses to this active element circuit 46 for allowing this active element circuit 46 to execute a sequence of operations. The active element circuit 46 and the timing control circuit 47 together construct, for example, a d-RAM. The timing pulses are supplied to the active element circuit 46 to sequentially operate these organic circuits which are required to operate step by step for normal d-RAM operation. That is, these organic circuits operate in response to the timing pulses, and a specified relationship is established between each of the timing pulses and a current flowing through the organic circuits. In the case where this active element circuit 46 is set into the operating mode in that a large consumption current is allowed to flow in response to a certain timing pulse TP1, this timing pulse TP1 is supplied as the control signal S1 to the MOS transistor 32.

For instance, in the d-RAM, a predetermined operation sequence is executed in response to a series of timing pulses, and a predetermined operating current is allowed to flow through this d-RAM in response to each timing pulse. Thus, it is possible to preliminarily determine a timing pulse which allows the operating current larger than the predetermined value to flow through this d-RAM so that such a timing pulse as to cause a large operating current can be extracted as the control signal S1.

The control signal S1 generated from the function circuit 40 in this way is supplied to the gate of the MOS transistor 32. When the control signal S1 is at a low level, or ground potential level, and when its source potential or operating voltage VC2 is held at a predetermined value, this MOS transistor 32 is kept in the nonconducting state; when the control signal S1 then becomes high or at a VC2 level, it becomes conductive. Due to this, the threshold voltage VTD of this MOS transistor 32 is determined so as to satisfy the following condition:

$$-(VR-VT)<VTD<0 \quad (4)$$

Where the equation VC2=VR−VT has been used.

In the semiconductor integrated circuit shown in FIG. 2, a signal is generated as the control signal S1 from the function circuit 40. This signal is maintained at the ground potential level while the function circuit 40 is operating in a first operating mode in which a group of organic circuits of the function circuit 40 which are small in circuit scale are in pause operation, and a small consumption current flows in this function circuit 40. On the other hand, this signal is set at the VC2 level while the function circuit 40 is operating in a second operating mode in which a group of organic circuits of the function circuit 40 which are large in circuit scale are in active operation, and a large consumption current flows in this function circuit 40. In the case where this function circuit 40 operates in the first operating mode, the MOS transistor 32 is kept in the nonconducting state since the operating voltage VC2 is held nearly at a predetermined value (VR−VT) by the MOS transistor 22 which receives at its gate the reference voltage VR. In addition, in the case where the function circuit 40 operates in the second operating mode, the MOS transistor 32 is rendered conductive in response to the control signal S1 generated from this function circuit 40, so that the conductance of the MOS transistor 32 increases. Namely, in this case, a larger current than before is supplied through the MOS transistors 22 and 32 to the function circuit 40. Therefore, the operating voltage VC2 can be stably kept at a predetermined value while the function circuit 40 needs little current flowing from the capacitor 23.

Assuming that the resultant conductance of the operating voltage supplying circuit constructed by the MOS transistors 22 and 32 when the MOS transistor 32 is conductive is gm1, that the conductance of the function circuit 40 at this time is gm2, and that the operating voltage VC2 when the MOS transistor 32 is in the nonconducting state is at a VC21 level, the variation in the operating voltage VC2 can be suppressed to be a minimum by setting the gm1 so as to satisfy the following expression:

$$\frac{gm1}{gm1 + gm2} \approx \frac{VC21}{VC1} \quad (5)$$

Figure 1:
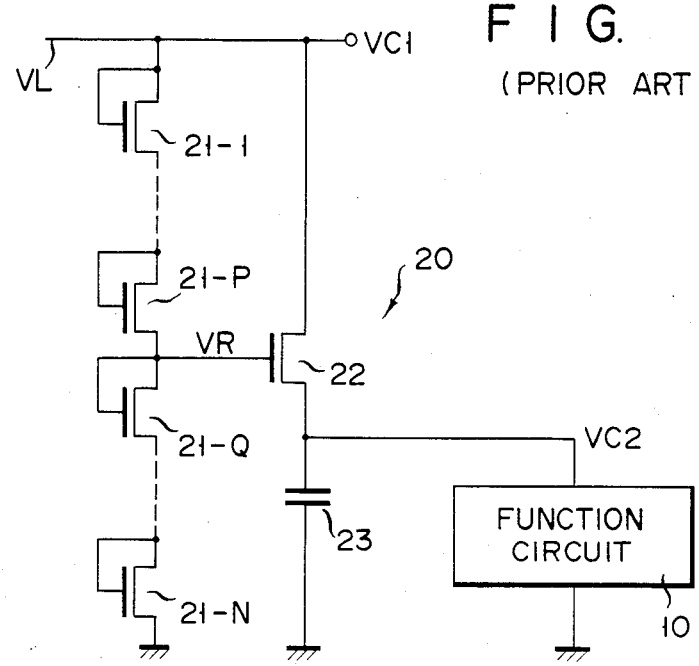
FIG. 1 shows a conventional semiconductor integrated circuit including a function circuit which is made operative at a voltage lower than a power supply voltage.
Figure 5:
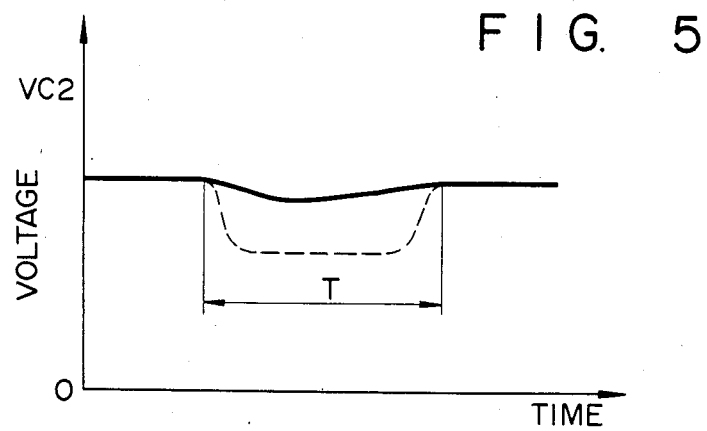
FIG. 5 is a graph showing a change in an operation voltage in each of the circuits shown in FIGS. 1 and 2.

FIG. 5 shows a time-variation in the operating voltage VC2 in the circuit shown in FIGS. 1 and 2. In this graph, a broken line and a solid line represent the cases in FIGS. 1 and 2, respectively. As is obvious from this graph, the operating voltage VC2 in the circuit shown in FIG. 1 largely varies in an interval T when the consumption current in the function circuit 10 is large. On the contrary, in the circuit shown in FIG. 2, the variation in the operating voltage VC2 is remarkably suppressed since the control signal S1 becomes the VC2 level and this renders the MOS transistor 32 conductive in the interval T during which a large consumption current flows in the function circuit 40.

In this embodiment, the variation in the operating voltage VC2 can be suppressed without employing the large capacitance of the capacitor 23 with the use of the MOS transistor 32. Consequently, it is not necessary to increase the area required to form the capacitor 23, thereby realizing high integration.

Figure 6:
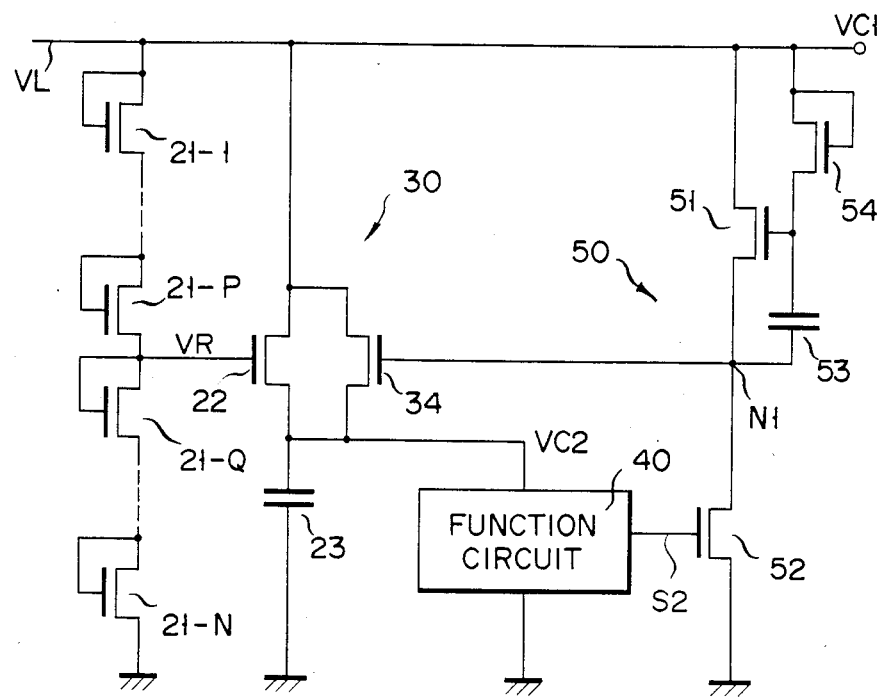
FIG. 6 shows a semiconductor integrated circuit according to another embodiment of the present invention.

FIG. 6 shows a semiconductor integrated circuit according to another embodiment of the present invention. This semiconductor integrated circuit is constituted substantially in the similar manner as that shown in FIG. 2 except that an enhancement type MOS transistor 34 is used in place of the depletion type MOS transistor 32 and that it is provided with a bootstrap type inverter circuit 50 for driving this MOS transistor 34 in response to the control signal S2 from the function circuit 40.

Figure 7A:
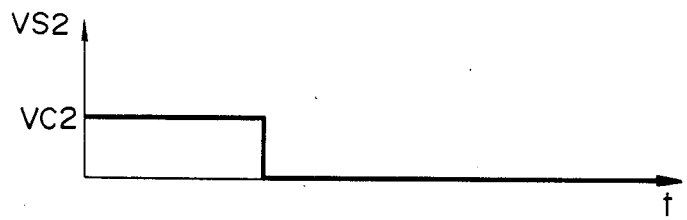
FIGS. 7A and 7B show signal waveform diagrams to describe the operation of the circuit shown in FIG. 6.

In this embodiment, in the case where a consumption current smaller than a predetermined value is flowing through the function circuit 40, a control signal S2 at a high level is generated from this function circuit 40 as shown in FIG. 7A. On the other hand, in the case where a consumption current larger than a predetermined value is flowing through the function circuit 40, this control signal S2 becomes low. For example, the control signal S2 is obtained by inverting the control signal S1 from the function circuit shown in FIGS. 3 or 4.

The bootstrap type inverter circuit 50 includes an MOS transistor 51 in which one end of a current path is coupled to the gate of the MOS transistor 34 and is also grounded through an MOS transistor 52, and in which the other end of this current path is coupled to the voltage line VL. The gate of this MOS transistor 51 is coupled through a capacitor 53 to a node N1 between the MOS transistors 51 and 52 and is also coupled to a voltage line VL through an MOS transistor 54 whose gate is coupled to the voltage line VL. In addition, the control signal S2 from the function circuit 40 is supplied to the gate of the MOS transistor 52.

In the ordinary operating mode, the operating voltage VC2 at the (VR'VT) level is supplied to the function circuit 40. A high level control signal S2 is generated from the function circuit 40 as shown in FIG. 7A, so that the MOS transistor 52 is made conductive. The gate voltage at the (VC1−VT) level is applied to the gate of the MOS transistor 51, thereby making this MOS transistor 51 conductive. Thus, the gate voltage obtained by dividing the voltage VC1 by a ratio between the ON resistances of the MOS transistors 51 and 52 is applied to the gate of the MOS transistor 34. In this embodiment, the ON resistance of the MOS transistor 51 is set to be larger than that of the MOS transistor 52, so that the gate voltage of the MOS transistor 34 is set to be a level near the ground potential level, i.e., lower than the (VR−VT) level. Therefore, in this case, the MOS transistor 34 is held in the nonconductive state.

Figure 7B:
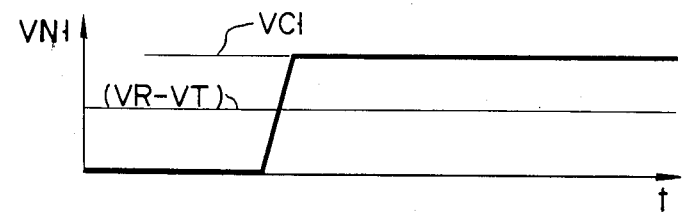

When the potential VS2 of the control signal S2 generated from the function circuit 40 becomes low as shown in FIG. 7A, the MOS transistor 52 becomes nonconductive, causing the potential VN1 at the node N1 to be rapidly increased through the MOS transistor 51 as shown in FIG. 7B. This increase in potential at the node N1 is transferred to the gate of the MOS transistor 51 through the capacitor 53, permitting the gate potential of this MOS transistor 51 to be set at a potential level higher than the (VC1+VT) level. Due to this, the MOS transistor 51 becomes to operate with the triode characteristics, thereby setting the potential at the node N1 at the VC1 level, making the MOS transistor 34 conductive, and increasing the resultant conductance of the operating voltage supplying circuit 30 constructed by the MOS transistors 22 and 34. Even in this case, by setting the resultant conductance of the operating voltage supplying circuit 30 so as to satisfy expression (5), the variation in the operating voltage VC2 can be suppressed to be small without the aid of the capacitor 23.

Figure 8:
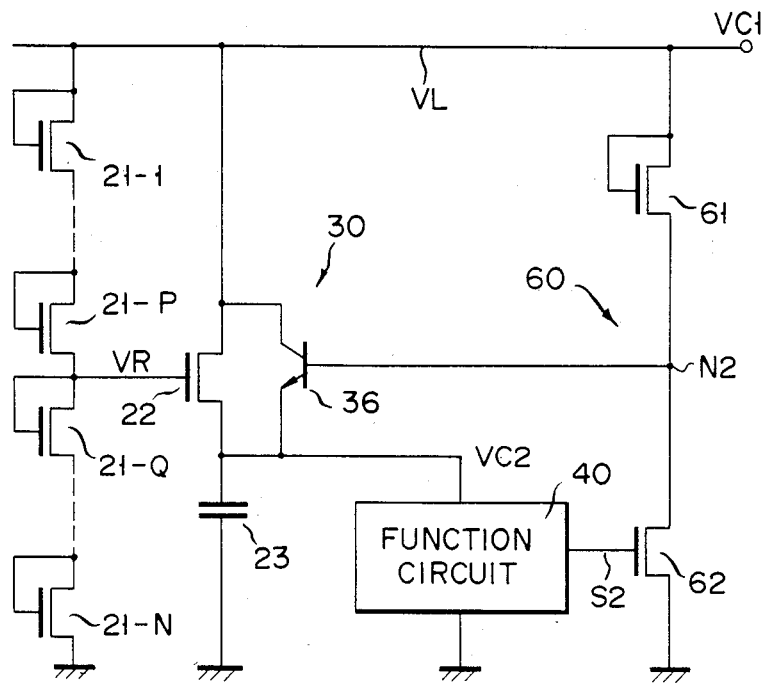
FIG. 8 shows a semiconductor integrated circuit according to another embodiment of the present invention.

FIG. 8 shows a semiconductor integrated circuit according to yet another embodiment of the present invention. This semiconductor integrated circuit is constituted substantially in the similar manner as that shown in FIG. 6 except that a bipolar transistor 36 having a large conductance is used in place of the MOS transistor 34 and that an inverter circuit 60 for inverting the control signal S2 from the function circuit 40 and supplying a base of the bipolar transistor 36 is used in place of the inverter circuit 50. The inverter circuit 60 includes an MOS transistor 61 whose gate and drain are coupled to the voltage line VL and whose source is grounded through an MOS transistor 62. This MOS transistor 62 is coupled to receive at its gate the control signal S2 from the function circuit 40. A node N2 between the MOS transistors 61 and 62 is connected to the base of the bipolar transistor 36.

In the ordinary operating mode, the control signal S2 at the VC2 level is generated from the function circuit 40 so that the MOS transistor 62 and bipolar transistor 36 are held in the conducting and non-conducting states, respectively. On the other hand, in the active operating mode, control signal S2 of 0V is generated from the function circuit 40. This permits the MOS transistor 62 to be nonconductive and the potential at the node N2 to become the (VC1−VT) level, so that the bipolar transistor 36 is rendered conductive. Thus, a large current is supplied through this transistor 36 to the function circuit 40.

Since a bipolar transistor can be constituted to have a larger conductance as compared with an MOS transistor even if the dimension of an element is small, this bipolar transistor 36 can be formed to be smaller than the MOS transistor 32 (FIG. 2) or the MOS transistor 34 (FIG. 6), thereby enabling the degree of integration to be improved.

Figure 9:
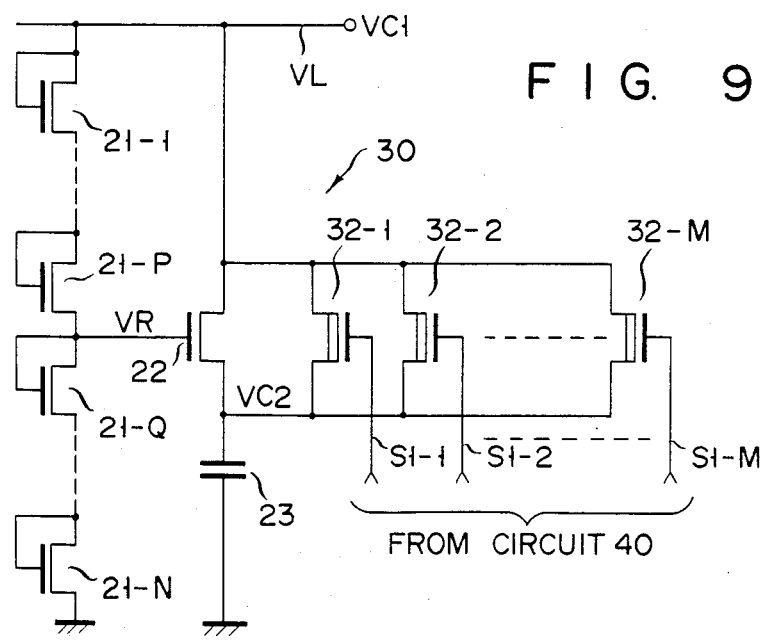
FIG. 9 shows a modification of an operating voltage supplying circuit in FIG. 2.

FIG. 9 shows a modification of the operating voltage supplying circuit 30 in FIG. 2. This circuit comprises M depletion type MOS transistors 32-1 to 32-M in place of the MOS transistor 32, in which each of these MOS transistors is connected in parallel with the MOS transistor 22. This circuit of FIG. 9 is suitable where the function circuit 40 is constituted by a circuit such as, for example, a RAM or the like whose consumption current sequentially varies in a series of operating modes when it executes a sequence of operations. In this case, the function circuit 40 rises at a predetermined timing to set the operating mode so that the consumption current will exceed a predetermined value and supplies each control pulse S1-1 to S1-M having pulse width corresponding to each time interval during which the consumption current is sequentially flowing through the MOS transistors 32-1 to 32-M. Due to this, even when a consumption current over a predetermined value flows through the function circuit 40, one of the MOS transistors 32-1 to 32-M is rendered conductive so that the instantaneous reduction in the operating voltage VC2 is suppressed to be small.

Figure 10:
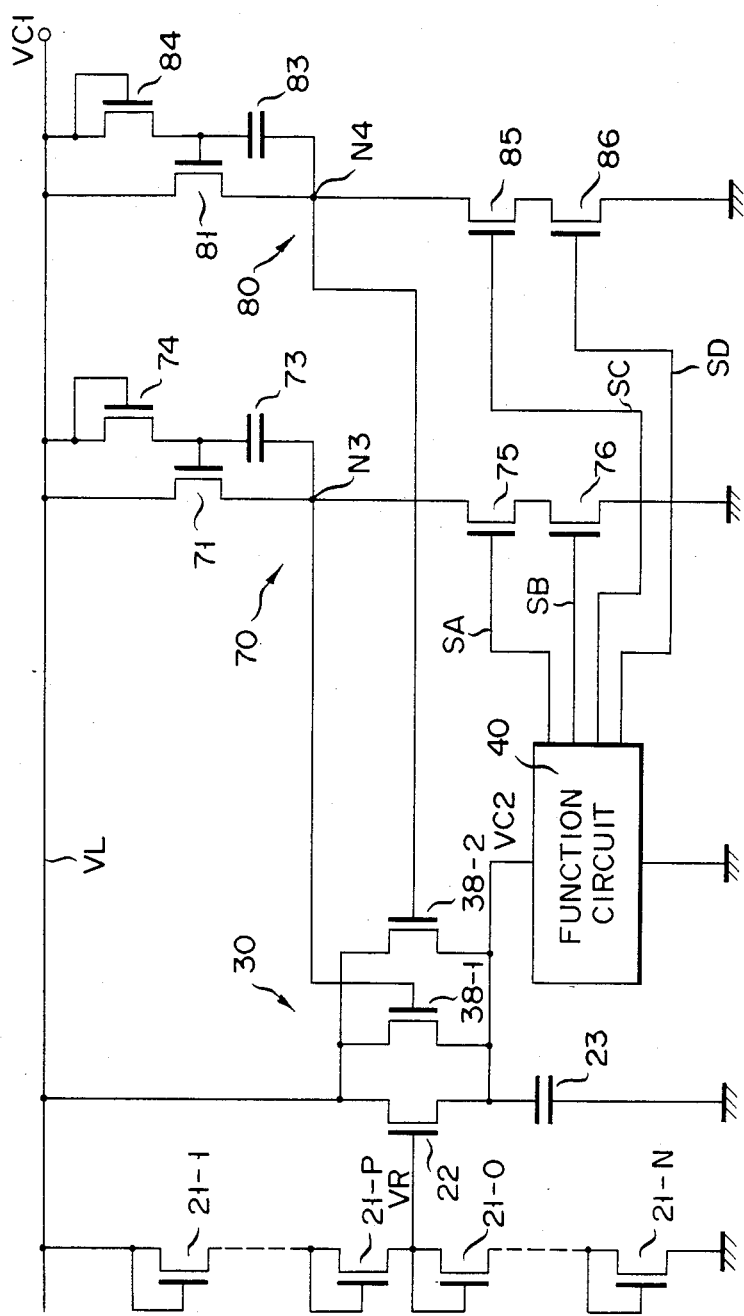
FIG. 10 shows a semiconductor integrated circuit according to another embodiment of the present invention which is included in a dynamic RAM.

FIG. 10 shows a semiconductor integrated circuit according to another embodiment of the present invention. In FIG. 10, the operating voltage supplying circuit 30 is constituted substantially in the similar manner as that shown in FIG. 6 except that it is provided with MOS transistors 38-1 and 38-2 each of which is connected in parallel with the MOS transistor 22 in place of the MOS transistor 34. Also, this integrated circuit has bootstrap type NAND gate circuits 70 and 80. This NAND gate circuit 70 includes MOS transistors 71 and 74 and a capacitor 73 which are coupled similarly to the MOS transistors 51 and 54 and capacitor 53 shown in FIG. 6; and MOS transistors 75 and 76 coupled in series between a node N3 and the ground. The NAND gate circuit 80 includes MOS transistors 81, 84, 85, and 86 and a capacitor 83 which are connected in a similar manner to the connection of the MOS transistors 71, 74, 75, and 76 and capacitor 73 of the NAND gate circuit 70. The MOS transistors 75 and 76 are controlled by control signals SA and SB from the function circuit 40, while the MOS transistors 85 and 86 are controlled by control signals SC and SD from the function circuit 40.

Figure 11:
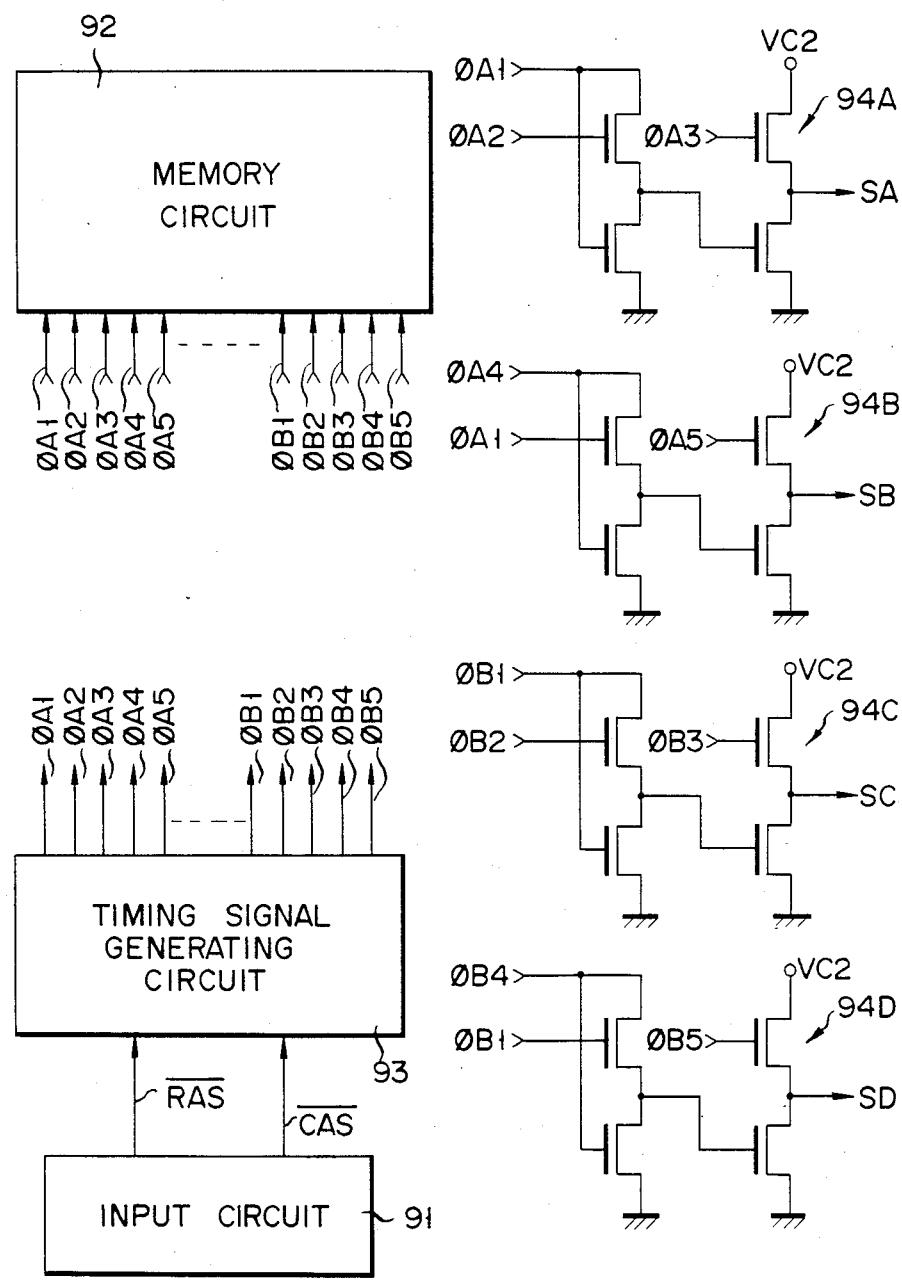
FIG. 11 shows a detailed circuit diagram of a function circuit in FIG. 10.
Figure 12:
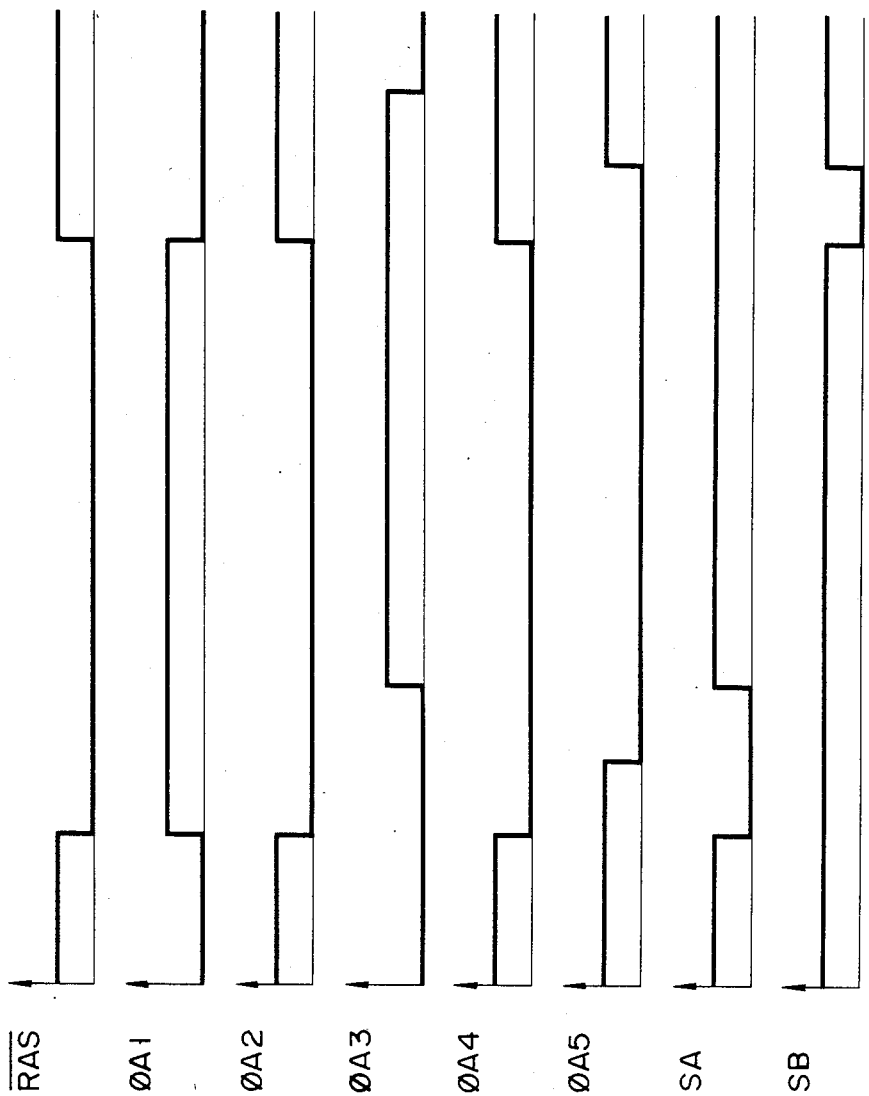
FIGS. 12A to 12H and FIGS. 13A to 13H show signal waveform diagrams to describe the operations of the circuits shown in FIGS. 10 and 11.

This function circuit 40 is constituted by, for example, a dynamic RAM as shown in FIG. 11. This dynamic RAM includes an input circuit 91 for converting a row address strobe signal $\overline{RAS}$ externally supplied and a column address strobe signal $\overline{CAS}$ externally supplied into an internal row address strobe signal $\overline{RAS}$ and an internal column address strobe signal $\overline{CAS}$, respectively; a memory circuit 92 having a memory cell of, e.g., 256 kbits; a timing signal generating circuit 93 for generating various timing signals including timing signals $\phi A1$ to $\phi A5$ and $\phi B1$ to $\phi B5$ for allowing the memory circuit 92 to execute a predetermined operation sequence in response to the internal strob signals $\overline{RAS}$ and $\overline{CAS}$ from the input circuit 91; and control signal generators 94A, 94B, 94C, and 94D for respectively generating the control signals SA, SB, SC, and SD in response to the timing signals $\phi A1$ to $\phi A5$ and $\phi B1$ to $\phi B5$ from the timing signal generating circuit 93. The timing signal generating circuit 93 generates timing signals including the timing signals $\phi A1$ to $\phi A5$ shown in FIGS. 12B to 12F in response to the internal $\overline{RAS}$ signal shown in FIG. 12A from the input circuit 91. The control signal generator 94A generates the control signal SA in response to the timing signals $\phi A1$, $\phi A2$ and $\phi A3$ from the timing signal generating circuit 93. The control signal SA becomes low synchronously with the fall or trailing edge of the internal $\overline{RAS}$ signal and thereafter rises synchronously with the rise or leading edge of the timing signal $\phi A3$ after, for example, 30 nsec has passed as shown in FIG. 12G. On the other hand, the control signal generator 94B generates the control signal SB in response to the timing signals $\phi A1$, $\phi A4$, and $\phi A5$ from the timing signal generating circuit 93. The control signal SB becomes low synchronously with the rise or leading edge of the internal $\overline{RAS}$ signal and thereafter rises synchronously with the rise or leading edge of the timing signal $\phi A5$ after, e.g., 15 nsec have passed as shown in FIG. 12H.

Figure 13:
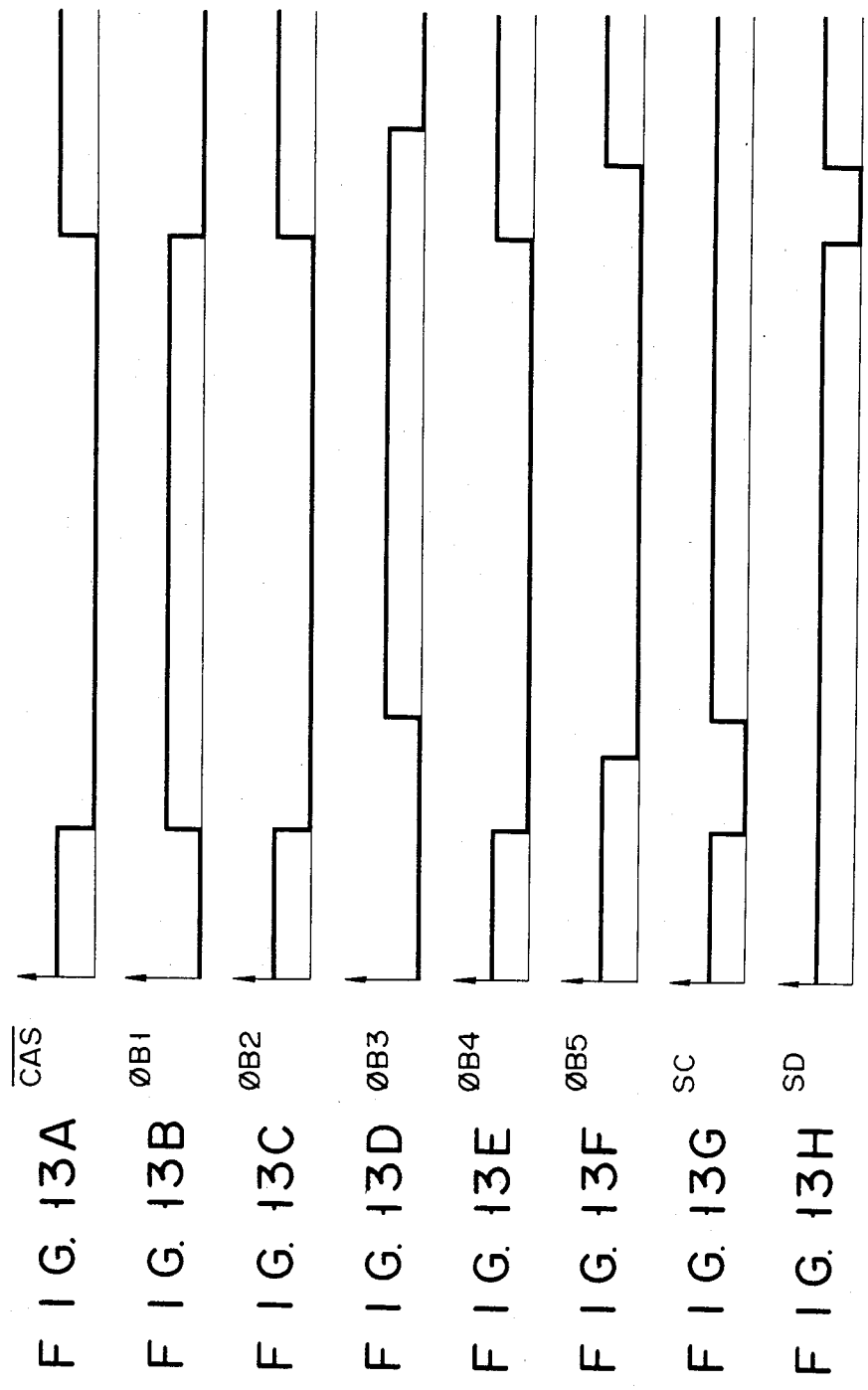

The timing signal generating circuit 93 generates timing signals including the timing signals $\phi B1$ to $\phi B5$ shown in FIGS. 13B to 13F in response to the internal $\overline{CAS}$ signal shown in FIG. 13A from the input circuit 91. The control signal generator 94C generates the control signal SC in response to the timing signals $\phi B1$, $\phi B2$ and $\phi B3$ from this timing signal generating circuit 93. The control signal SC becomes low synchronously with the fall or trailing edge of the internal $\overline{CAS}$ signal and thereafter rises synchronously with the rise or leading edge of the timing signal $\phi B3$ after, e.g., 25 nsec has passed as shown in FIG. 13G. In addition, the control signal generator 94D generates the control signal SD in response to the timing signals φB1, φB4 and φB5 from the timing signal generating circuit 93. The control signal SD becomes low synchronously with the rise or leading edge of the internal $\overline{CAS}$ signal and thereafter rises synchronously with the rise or leading edge of the timing signal φB5 after, e.g., 15 nsec have passed as shown in FIG. 13H.

In the case where all of the control signals SA, SB, SC, and SD from the function circuit 40 are at a high level, all of the MOS transistors 75, 76, 85, and 86 are made conductive, and the nodes N3 and N4 are held near at the ground potential level, so that the MOS transistors 38-1 and 38-2 are held into the non-conducting state. Now assuming that the internal $\overline{RAS}$ signal falls to ground level, the control signal SA falls synchronously with the fall or trailing edge of this internal $\overline{RAS}$ signal, thereby causing the MOS transistor 75 to be nonconductive for about 30 nsec. Due to this, the potential at the node N3 rises to the VC1 level in the similar manner as described in FIG. 6, thereby making the MOS transistor 38-1 conductive. In addition, the control signal SB falls synchronously with the rise or leading edge of this internal $\overline{RAS}$ signal, thereby making the MOS transistor 76 nonconductive for about 15 nsec. Thus, the MOS transistor 38-1 is rendered conductive, thereby causing the resultant conductance of the operating voltage supplying circuit 30 constructed by the MOS transistors 22, 38-1 and 38-2 to be increased.

When the internal $\overline{CAS}$ signal is generated, the MOS transistor 38-2 is rendered conductive for about 25 nsec at the fall or trailing edge of this CAS signal and for about 15 nsec at the rise or leading edge.

Although a large consumption current over a predetermined value is consumed at the memory circuit 92 when the internal $\overline{RAS}$ and $\overline{CAS}$ signals are transmited, the operating voltage VC2 is not largely varied by this large consumption current.

The variation rates of the operating voltages VC2 in the circuit shown in FIG. 10 and those of the conventional circuit, in which the MOS transistors 38-1 and 38-2 and the bootstrap type NAND gate circuits 70 and 80 were removed from that circuit in FIG. 10, were experimentally examined. In this examination, the variation rate in the circuit of the present invention was below 5%, while the variation rate in the conventional circuit was about 30%. In addition, to suppress this voltage variation rate to a value below 10%, the value of the capacitor 23 may be set to about only 4000 pF in the circuit of the present invention, but in the conventional circuit, the value of this capacitor must be set at about 30000 pF.

As seen in the above results, in this embodiment, it is possible to suppress the variation in the operating voltage VC2 to be small without greatly increasing the capacitance of the capacitor 23.

Figure 14:
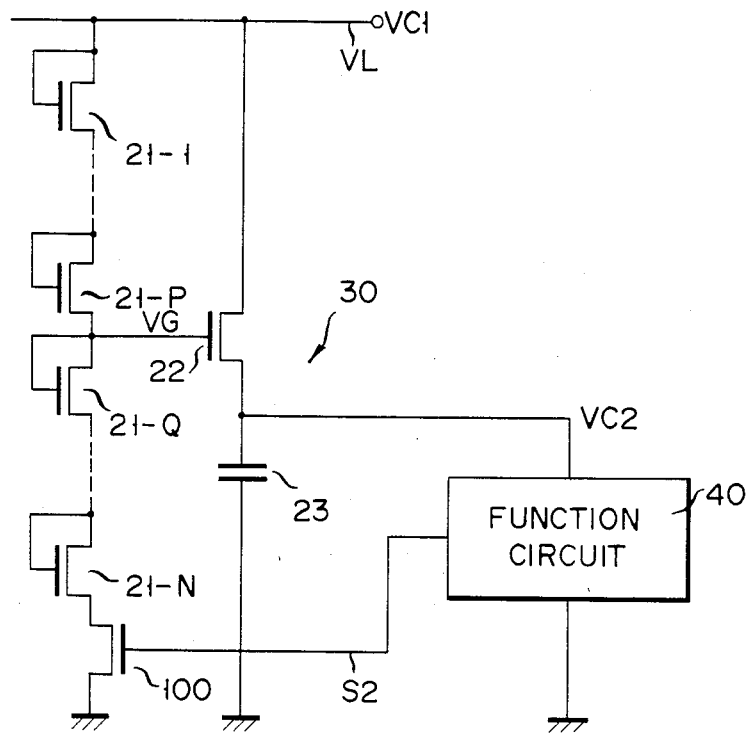
FIG. 14 shows a semiconductor integrated circuit according to still another embodiment of the present invention.

FIG. 14 shows a semiconductor integrated circuit according to yet another embodiment of the present invention. This circuit is constituted substantially in the similar manner to that shown in FIG. 2 except that the MOS transistor 32 is omitted and that an enhancement type MOS transistor 100 is connected in series with the MOS transistors 21-1 to 21-N. In addition, in this integrated circuit, the function circuit 40 generates the control signal S2.

In the ordinary operating mode, the control signal S2 at a high level is supplied to a gate of the MOS transistor 100, and this MOS transistor 100 is kept conductive while a predetermined voltage VG1 as a gate voltage VG is applied to the gate of the MOS transistor 22. On the other hand, in the active operating mode where a consumption current over a predetermined value is allowed to flow through the function circuit 40, the control signal S2 at a low level is supplied to the gate of the MOS transistor 100, thereby making this MOS transistor nonconductive. Due to this, the gate voltage VG with a voltage VG2 higher than the foregoing predetermined voltage VG1 is applied to the gate of the MOS transistor 22, thereby causing the conductance of the operating voltage supplying circuit constructed by the MOS transistor 22 to be increased. Thus, a larger current is supplied through the MOS transistor 22 to the function circuit 40, thereby suppressing the reduction in the operating voltage VC2.

Figure 15:
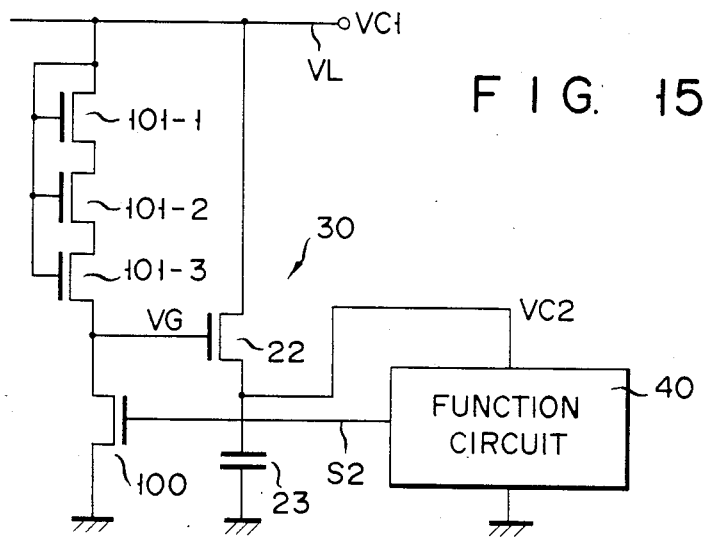
FIG. 15 shows a modification of the circuit of FIG. 14.

FIG. 15 shows a modification of the integrated circuit shown in FIG. 14. In this integrated circuit, MOS transistors 101-1 to 101-3 whose respective gates are coupled to the voltage line VL and which are mutually coupled in series are used in place of the MOS transistors 21-1 to 21-P, and the MOS transistors 21-Q to 21-N are omitted.

In this integrated circuit as well, in the ordinary operating mode, the MOS transistor 100 is rendered conductive, and a gate voltage VG with a voltage VG3 to be determined in dependence upon a ratio between a reciprocal of the resultant conductance of the MOS transistors 101-1 to 101-3 and a reciprocal of the conductance of the conducting MOS transistor 100 is applied to the MOS transistor 22. In contrast, in the active operating mode, the MOS transistor 100 is nonconducting, so that a gate voltage higher than the voltage VR3 is applied to the gate of the MOS transistor 22 thereby allowing the conductance of this MOS transistor 22 to be increased.

Although the present invention has been described with respect to the above embodiments, the invention is not limited to only these embodiments. For example, although one MOS transistor 22 is coupled between the voltage line VL and the terminal VC2, a plurality of parallel connected MOS transistors may be coupled in place of this MOS transistor 22.

What is claimed is:

1. A semiconductor integrated circuit comprising:
    a function circuit having a plurality of active elements for performing a predetermined circuit function and generating at least one control signal, said function circuit being coupled between a node and a reference terminal and having at least two operating modes;
    potential setting means, coupled between a power supply terminal and said node and controlled by said control signal from said function circuit, for setting the potential at said node to a predetermined value irrespective of said operating mode of said function circuit by varying a conductance between said power supply terminal and said node in response to said control signal from said function circuit; and
    capacitor means, coupled between said node and said reference terminal, for smoothing the potential at said node.

2. A semiconductor integrated circuit according to claim 1, wherein said function circuit comprises an operation mode setting circuit for generating at least one operation mode setting signal to set said operating mode of said function circuit and to generate said control signal in response to said operation mode signal.

3. A semiconductor integrated circuit according to claim 2, wherein said potential setting means comprises first circuit means which has a substantially constant conductance irrespective of the control signal from said function circuit; and second circuit means which is coupled in parallel with said first circuit means and whose conductance is varied in response to the control signal from said function circuit, both said first circuit means and said second circuit means being connected between said power supply terminal and said node.

4. A semiconductor integrated circuit according to claim 3, wherein said first circuit means comprises an MOS transistor which receives at its gate a reference voltage.

5. A semiconductor integrated circuit according to claim 3, wherein said second circuit means comprises a depletion type MOS transistor which receives at its gate said control signal from said function circuit.

6. A semiconductor integrated circuit according to claim 3, wherein said function circuit generates a plurality of mutually different control signals and said second circuit means comprises a plurality of depletion type MOS transistors which are coupled in parallel and which receive at their respective gates said plurality of control signals from said function circuit.

7. A semiconductor integrated circuit according to claim 3, wherein said second circuit means comprises a voltage generating circuit and an enhancement type MOS transistor whose gate receives a gate voltage from said voltage generating circuit in response to said control signal from said function circuit.

8. A semiconductor integrated circuit according to claim 7, wherein said voltage generating circuit has a bootstrap circuit for generating a gate voltage in response to said control signal from said function circuit.

9. A semiconductor integrated circuit according to claim 3, wherein said second circuit means comprises a bipolar transistor; and a base potential setting circuit for setting a base potential of said bipolar transistor in response to said control signal from said function circuit.

10. A semiconductor integrated circuit according to claim 3, wherein said function circuit generates mutually different control signals and said second circuit means includes a plurality of voltage generating circuits and a plurality of enhancement type MOS transistors which are connected in parallel and which receive at their respective gates gate voltages from said plurality of voltage generating circuits in response to said mutually different control signals from said function circuit.

11. A semiconductor integrated circuit according to claim 10, wherein each of said plurality of voltage generating circuits includes a bootstrap circuit for generating a gate voltage in response to said mutually different control signals from said function circuit.

12. A semiconductor integrated circuit according to claim 2, wherein said potential setting means comprises a gate voltage generating circuit controlled by said control signal from said function circuit and at least one MOS transistor whose gate is connected to receive a gate voltage from said gate voltage generating circuit.

13. A semiconductor integrated circuit according to claim 12, wherein said gate voltage generating circuit comprises first resistor means coupled between said power supply terminal and the gate of said at least one MOS transistor; and a series circuit of second resistor means and a further MOS transistor coupled between the gate of said at least one MOS transistor and said reference terminal and the conduction state of said further MOS transistor being controlled in response to said control signal from said function circuit.

14. A semiconductor integrated circuit according to claim 12, wherein said gate voltage generating circuit includes resistor means coupled between said power supply terminal and the gate of said at least one MOS transistor; and a further MOS transistor which is coupled between said resistor means and said reference terminal and whose conduction state is controlled by said control signal from said function circuit.

15. A semiconductor integrated circuit according to claim 1, wherein said function circuit comprises detecting means for detecting that a consumption current flowing through said function circuit exceeds a predetermined value and generating said control signal.

16. A semiconductor integrated circuit according to claim 15, wherein said potential setting means comprises first circuit means which has a constant conductance with respect to said control signal from said function circuit; and second circuit means which is coupled in parallel with said first circuit means and whose conductance is varied in response to said control signal from said function circuit, both said first circuit means and second circuit means being connected between said power supply terminal and said node.

17. A semiconductor integrated circuit according to claim 16, wherein said first circuit means includes a reference voltage generating circuit and an MOS transistor which receives at its gate a reference voltage from said reference voltatge generating circuit.

18. A semiconductor integrated circuit according to claim 16, wherein said second circuit means comprises a depletion type MOS transistor which receives at its gate said control signal from said function circuit.

19. A semiconductor integrated circuit according to claim 16, wherein said second circuit means comprises a voltage generating circuit and an enhancement type MOS transistor whose gate is connected to receive a gate voltage from said voltage generating circuit in response to said control signal from said function circuit.

20. A semiconductor integrated circuit according to claim 19, wherein said voltage generating circuit has a bootstrap circuit for generating a gate voltage in response to said control signal from said function circuit.

21. A semiconductor integrated circuit according to claim 16, wherein said second circuit means comprises a bipolar transistor; and a base potential setting circuit for setting a base potential of said bipolar transistor in response to said control signal from said function circuit.

* * * * *